United States Patent [19]
Lee et al.

[11] Patent Number: 5,283,757
[45] Date of Patent: Feb. 1, 1994

[54] HIGH SPEED BICMOS MEMORY HAVING LARGE NOISE MARGIN AND REPEATABLE READ PORT

[75] Inventors: Lo-Shan Lee, San Diego; Babak Mansoorian, La Jolla, both of Calif.

[73] Assignee: Unisys Corporation, Blue Bell, Pa.

[21] Appl. No.: 843,403

[22] Filed: Feb. 28, 1992

[51] Int. Cl.$^5$ .................... G11C 7/00; G11C 11/40
[52] U.S. Cl. .................... 365/177; 365/154; 365/156
[58] Field of Search ................. 365/156, 154, 177, 204

[56] References Cited

U.S. PATENT DOCUMENTS

| | | | |
|---|---|---|---|
| 4,833,648 | 5/1989 | Scharrer et al. | 365/154 |
| 4,933,899 | 6/1990 | Gibbs | 365/154 |
| 4,984,203 | 1/1991 | Shookhtim et al. | 365/177 |
| 4,995,001 | 2/1991 | Dawson et al. | 365/154 |
| 5,003,509 | 3/1991 | Bosnyak | 365/177 |
| 5,189,640 | 2/1993 | Huard | 365/154 |

*Primary Examiner*—Eugene R. LaRoche
*Assistant Examiner*—Andrew Tran
*Attorney, Agent, or Firm*—Charles J. Fassbender; Mark T. Starr

[57] ABSTRACT

A memory that is comprised of an array of memory cells which are made of cross-coupled field effect transistors further has a novel read port to read data from the cells. This read port includes a) a respective P-channel transistor for each memory cell having a gate coupled to a set or reset node of the cell; b) each P-channel transistor in a row of memory cells has a drain coupled to a respective row line for the row of cells which is otherwise disconnected from the cells; c) each P-channel transistor has a source coupled to the base of a respective bipolar transistor; and, d) each bipolar transistor in a column of memory cells has a collector coupled to a voltage bus and has an emitter coupled via a bit line to a sense amplifier for the column. With this read port structure "1" and "0" data bits can be read from the cells with both a high speed and a high noise margin. Any number of additional read ports can be provided by simply duplicating the components a) thru d) for each such port.

14 Claims, 5 Drawing Sheets

HIGH SPEED BICMOS MEMORY HAVING LARGE NOISE MARGIN AND REPEATABLE READ PORT

BACKGROUND OF THE INVENTION

This invention relates to the structure and operation of BiCMOS static memories.

Basically, a BiCMOS memory is a memory which is made of both bipolar transistors and field effect transistors. One such memory is described, for example, in U.S. Pat. No. 4,984,203 (hereinafter U.S. Pat. No. '203) issued Jan. 8, 1991 which is assigned to the present assignee.

Included in the memory of U.S. Pat. No. '203 is a rowcolumn array of memory cells. Each cell is made entirely of field effect transistors which are cross-coupled to each other. On the other hand, bipolar transistors are used in the memory to read data from the cells.

Field effect transistors are inherently smaller in size than bipolar transistors, and thus the memory cells of U.S. Pat. No. '203 have a high packing density. By comparison, bipolar transistors have a faster switching speed than field-effect transistors, and thus the memory of U.S. Pat. No. '203 has a high read speed.

However, one drawback which the U.S. Pat. No. '203 memory has is that the "1" voltage level within each memory cell is not fixed. Instead, only the "0" voltage level is fixed by a supply voltage on the source of the memory cell transistors Q1 and Q2; and, the "1" voltage moves up and down with the select and deselect voltages that are applied by the select lines to the drain of the cell transistors Q3 and Q4. This up and down movement of the "1" voltage level limits the degree to which the "0" voltage can be shifted towards the "1" voltage before errors due to noise start to occur.

Suppose, for example, that the "1" voltage level switches between −1.0 volts and −1.6 volts as shown in FIG. 2 of U.S. Pat. No. '203, and suppose that the "0" voltage is shifted from −5.2 volts to −3.4 volts. Such a shift in the "0" voltage level would be desirable in order to reduce the voltage across the cell transistors Q1–Q4 and thereby allow those transistors to be scaled down in size.

In the above example, when a cell is selected, the "1" voltage differs from the "0" voltage by 3.4 volts minus 1.0 volts or 2.4 volts. However, when a cell is deselected, the "1" voltage differs from the "0" voltage by only 3.4 volts minus 1.6 volts or 1.8 volts. This reduction in the difference between a "1" and "0" voltage increases the cell's susceptible to errors due to noise,—i.e. it reduces the cell's noise margin.

An additional limitation of U.S. Pat. No. '203 memory is that the memory cells cannot accommodate more than two read ports. This is because in U.S. Pat. No. '203, only one read port can be connected to the set node S of a cell and only one read port can be connected to the reset node R of a cell.

Accordingly, a primary object of the present invention is to provide a novel BiCMOS memory which has a high speed, a high cell density, a low susceptibility to noise as the "1" and "0" voltage levels approach each other, and can accommodate more than two read ports.

BRIEF SUMMARY OF THE INVENTION

In one embodiment of the present invention, the above object is achieved by an integrated circuit memory that is comprised of a plurality of memory cells which are made of cross-coupled field effect transistors and are arranged in rows and columns; wherein, to read data from the cells, the memory further has the following novel structure: a) a respective P-channel transistor for each memory cell having a gate coupled to a set or reset node of the cell; b) each P-channel transistor in a row of memory cells has a drain coupled to a respective row line for the row of cells which is otherwise disconnected from the cells; c) each P-channel transistor has a source coupled to the base of a respective bipolar transistor; and, d) each bipolar transistor in a column has a collector coupled to a voltage bus and has an emitter coupled via a bit line to a sense amplifier for the column. Each row line carries select and deselect voltages $V_S$ and $V_D$; each cell stores "1" and "0" voltages $V_1$ and $V_0$; and each P-channel transistor has a predetermined threshold voltage $V_T$. Both $V_S$-$V_0$ and $V_D$-$V_0$ are larger than $V_T$, and both $V_S$-$V_1$ and $V_D$-$V_1$ are less than $V_T$. Thus, each P-channel transistor is ON whenever the memory cell to which it is connected stores a "0", and each P-channel transistor is OFF whenever the memory cell to which it is connected stores a "1". An ON P-channel transistor transfers the row line voltage to the base of its respective bipolar transistor; and, that base voltage is sensed by the sense amplifier as a "0" if the row line is selected and as a "1" if the row line is deselected. An OFF P-channel transistor causes the voltage on the base of the respective bipolar transistor to discharge, and that discharge voltage is sensed by the sense amplifier as a "1". This READ operation occurs for "1" and "0" voltage levels which are within 2.6 volts of each other. Also, any number of additional read ports can be established by simply duplicating the components a) thru d) for each added read port.

BRIEF DESCRIPTION OF THE DRAWINGS

Various embodiments of the invention are described herein in conjunction with the accompanying drawings wherein.

DETAILED DESCRIPTION OF THE INVENTION

Figure 1:
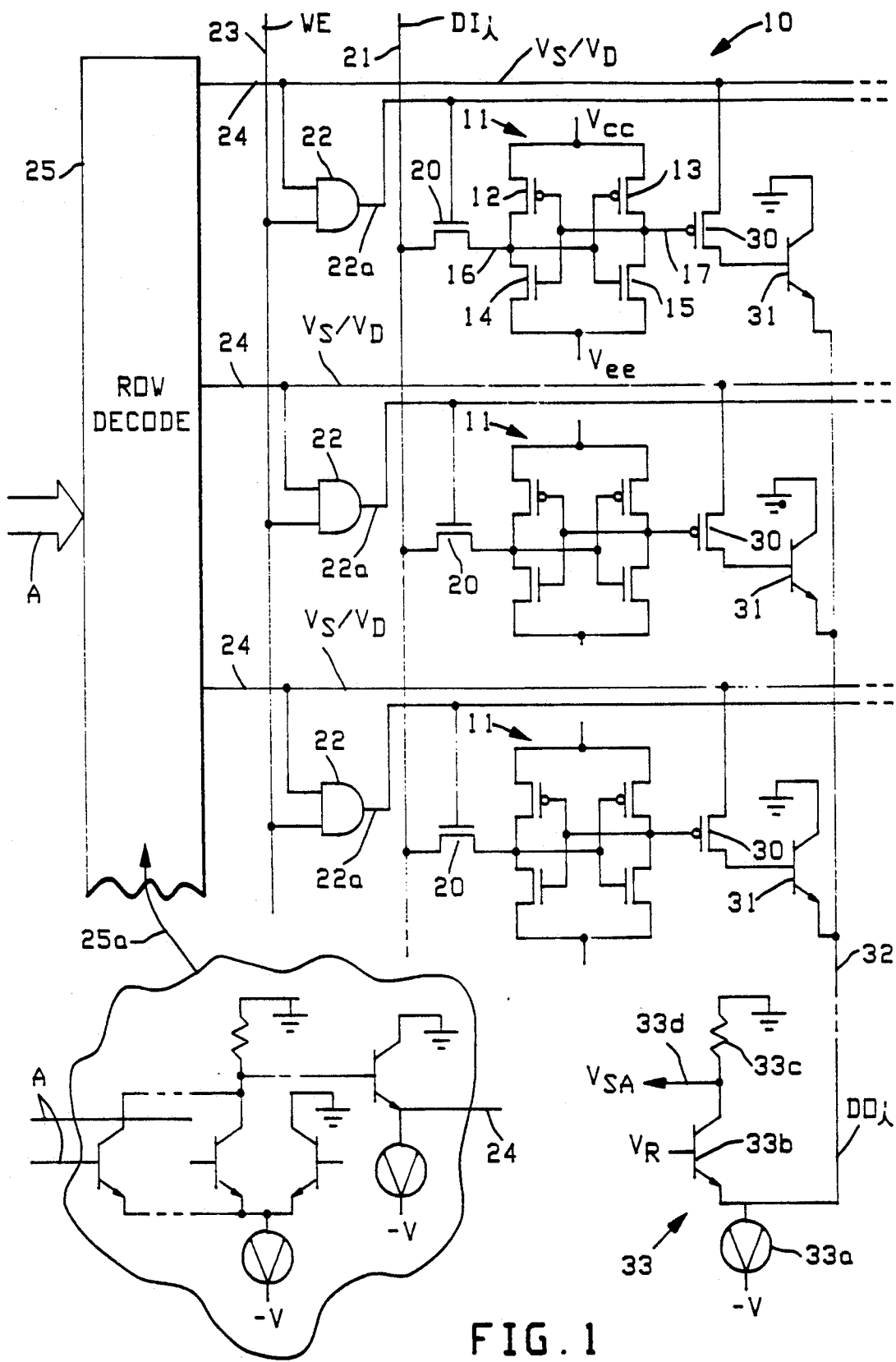
FIG. 1 shows the structure of a first preferred embodiment of the invention.

Referring now to FIG. 1, it shows the structure of a memory 10 which is as one preferred embodiment of the invention. Included in the memory 10 are a plurality of memory cells 11 that are arranged in an array of rows and columns. The cell 11 which is closest to the top of FIG. 1 is in the first row and the first column; the next adjacent cell 11 shown is in the second row and the first column; and the last cell 11 shown is in the third row and the first column. In each row and in each column of the memory 10, the cells 11 are repeated a predetermined number of times.

Each of the memory cells 11 includes two P-channel transistors 12 and 13 and two N-channel transistors 14 and 15. These transistors 12 thru 15 are cross-coupled to each other as shown, and they are interconnected between two fixed supply voltages $V_{cc}$ and $V_{ee}$. Voltage $V_{cc}$ represents a binary "1", and it is more positive than voltage $V_{ee}$. Voltage $V_{ee}$ represents a binary "0". An input node to the cell is indicated by reference numeral 16, and an output node from the cell is indicated by reference numeral 17.

To selectively write a binary "1" and/or "0" into the memory cells, the following circuitry is provided: a respective N-channel transistor 20 for each memory cell, a respective data input line 21 for each column of memory cells, a respective AND gate 22 for each row of memory cells, a single write enable line 23, a respective row line 24 for each row of memory cells, and a row decoder 25. All these components are interconnected as shown.

In operation, the row decoder 25 receives a binary address A; and in response, the row decoder 25 generates a select voltage $V_S$ on one of the row lines 24 and it generates a deselect voltage $V_D$ on the remaining row lines. The select voltage $V_S$ on the one row select line 24 is received by one particular AND gate 22; and, that AND gate turns ON all of transistors 20 to which it is connected if the write enable signal WE on line 23 is true. All of the AND gates 22 which receive the deselect voltage $V_D$ turn OFF the transistors 20 to which they are connected. Those memory cells which have their transistors 20 turned ON receive a data input bit $DI_i$ from the data input line 21. All other memory cells stay unchanged.

When a "1" data bit is written into a memory cell, transistors 13 and 14 turn ON and transistors 12 and 15 turn OFF. In that case, the voltage on the memory cell output terminal 17 is $V_1$ which equals $V_{cc}$. Conversely, when a "0" data bit is written into a memory cell, transistors 12 and 15 turn ON, and transistors 13 and 14 turn OFF. In that case, the output voltage on terminal 17 is $V_0$ which equals $V_{ee}$.

To selectively read the data bits from the memory 10, the following components are provided: a respective P-channel transistor 30 for each memory cell 11, a respective NPN bipolar transistor 31 for each memory cell 11, a respective data output line 32 for each column of memory cells, and a respective sense amplifier 33 for each column of memory cells. Sense amplifier 33 includes a current source 33a, a bipolar transistor whose base is biased with a reference voltage $V_R$ which lies midway between the select and deselect voltages $V_S$ and $V_D$, a resistor 33c, and an output line 33d. All of these components are interconnected to each other, as well as to the row lines 24 and the row decoder 25, as shown.

Figure 2:
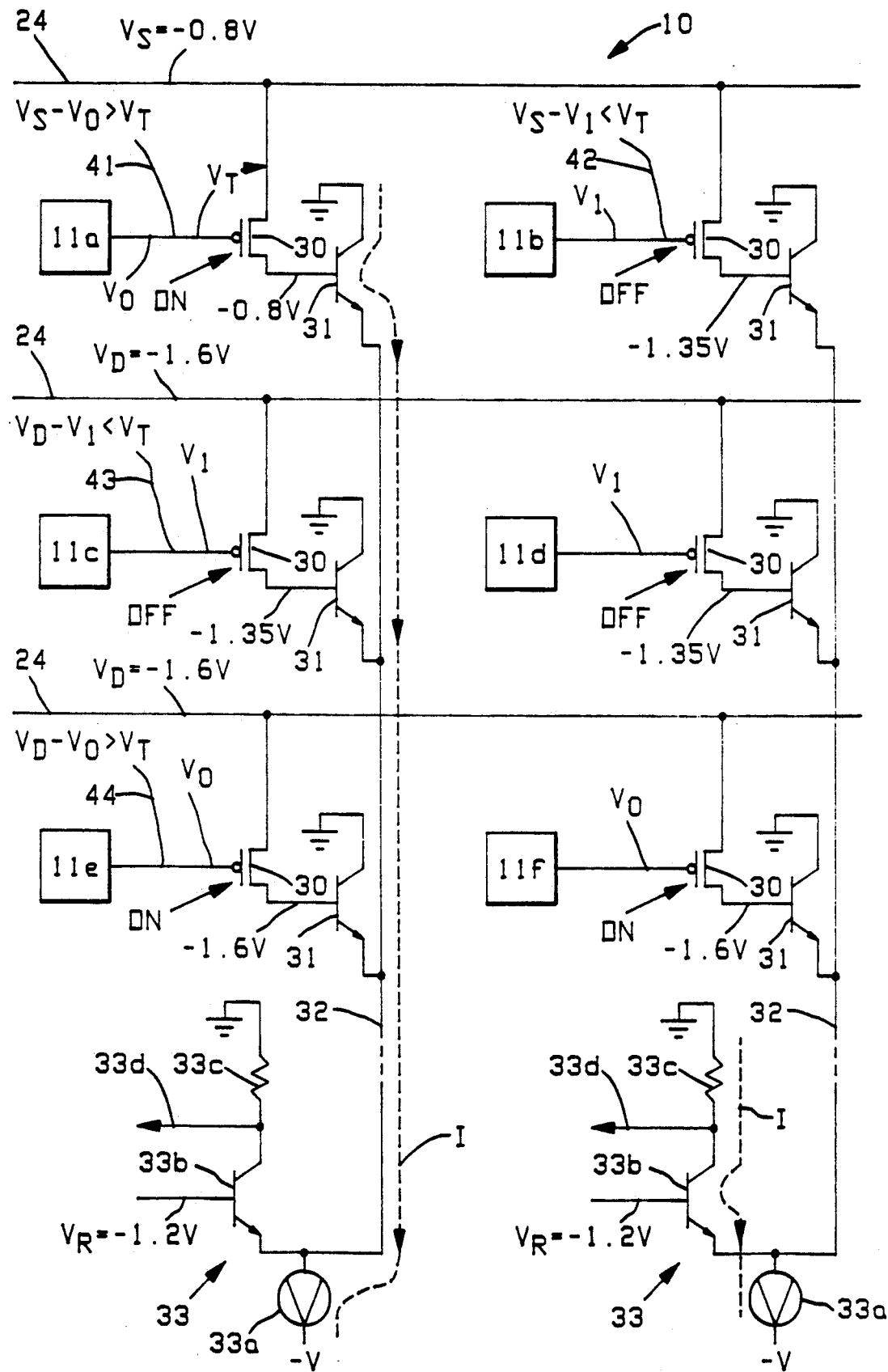
FIG. 2 illustrates the operation of the FIG. 1 embodiment.

How the above described components 24, 25 and 30-33 operate to read data from the memory cells is shown in FIG. 2. That figure contains six memory cells 11a thru 11f. Two of the memory cells, 11a and 11b, are in a first row which is being selected by the select voltage $V_s$ from the row decoder. Two other cells, 11c and 11d are in a second row which is being deselected by the deselect voltage $V_D$ from the row decoder. The remaining two cells, 11e and 11f, are in a third row which is also being deselected.

In FIG. 2, the select voltage $V_s$ on the row line 24 is $-0.8$ volts, and the deselect voltage $V_D$ on the row line 24 is $-1.6$ volts. A conventional decoder circuit for generating these particular select and deselect voltages is indicated by reference numeral 25a in FIG. 1; and, one such circuit is included in the row decoder 25 for each row line. These select and deselect voltages of $-0.8$ volts and $-1.6$ volts are sent via the row lines 24 to the drain of the P-channel transistors 30.

Each of the P-channel transistors 30 has a predetermined threshold voltage $V_T$ which must be exceeded in order for the transistor to turn ON. To exceed this threshold voltage, the voltage on the drain of transistor 30 must be at least $V_T$ volts more positive than the voltage on the gate of transistor 30.

In FIG. 2, the above turn ON condition is met by all of the transistors 30 which are connected to a memory cell 11 that stores a "0" data bit. Conversely, the condition for turning ON a transistor 30 is not met by all of the transistors 30 which are connected to a memory cell that store a "1" data bit. In FIG. 2, "1" data bits are stored in the cells 11b, 11c, and 11d; and "0" data bits are stored in the cells 11a, 11e, and 11f.

When a transistor 30 is turned ON, the voltage that is on the row line 24 is transferred through the transistor 30 to the base of its corresponding bipolar transistor 31. Thus the transistor 30 which is connected to cell 11a transfers the select voltage $V_S$ of $-0.8$ volts from the row line 24 to the base of its transistor 31. Likewise, the transistors 30 which are connected to the memory cells 11e and 11f transfer the deselect voltage $V_D$ of $-1.6$ volts from the row line 24 to the base of their corresponding transistors 31.

Conversely, when a transistor 30 is turned OFF, the voltage on the row line 24 is blocked from passing through that transistor. Thus, the base of the corresponding bipolar transistor 31 receives no base current; and so the base voltage discharges until the bipolar transistor 31 turns-OFF. This turn OFF occurs when the base voltage of a bipolar transistor 31 discharges to about 0.15 volts below the reference voltage $V_R$ on the sense amplifier transistor 33b.

After the respective voltages are established on the base of all of the bipolar transistors 31, those voltages are compared to the reference voltage $V_R$ on the base of transistor 33b in the sense amplifier. If the base voltage of any one of the transistors 31 in a column is more positive than the base voltage of transistor 33b in that column, then all of the current I from the sense amplifier current source 33a passes through that one transistor 31. This occurs in the sense amplifier for the column of cells on the left hand side of FIG. 2. Consequently, no voltage drop occurs across the sense amplifier resistor 33c; and so the voltage on the sense amplifier output line 33d goes high.

On the other hand, if all of the transistors 31 of a column have a base voltage which is more negative than the reference voltage $V_R$ on the base of transistor 33b, then all of the current I from the current source 33a passes through transistor 33b. This occurs in the sense amplifier for the column of memory cells which is on the right hand side of FIG. 2. There, the current I causes a voltage drop across resistor 33c which generates a low output voltage on the sense amplifier output line 33d.

In order to insure that the transistors 30 turn ON and turn OFF as described above, certain constraints on the $V_1 V_0$, $V_S$, $V_D$, and $V_T$ voltage levels have to be met. These constraints are expressed in FIG. 2 by equations 41 thru 44. Equations 41 and 44 state the constraints for turning ON the transistors 30 when the memory cells store voltage $V_0$; and, equations 42 and 43 state the constraints for turning OFF the transistors 30 when the memory cells store voltage $V_1$.

According to equation 41, voltage $V_S$ minus voltage $V_0$ must be more than the threshold voltage $V_T$. By comparison, equation 44 says voltage $V_D$ minus voltage $V_0$ must be more than the threshold voltage $V_T$. Given a row select voltage of $-0.8$ volts, a row deselect voltage of $-1.6$ volts and a threshold voltage of 1 volt, equations 41 and 44 together require the $V_0$ voltage to be more negative than $-2.6$ volts.

Equation 42 says the $V_S$ minus the voltage $V_1$ must be less than the threshold voltage $V_T$. By comparison, equation 43 says the voltage $V_D$ minus the voltage $V_1$ must be less than the threshold voltage $V_T$. Given a row select voltage of $-0.8$ volts, a row deselect voltage of $-1.6$ volts, and a threshold voltage of 1 volt, these two equations 42 and 43 together constrain the $V_1$ voltage to be more positive than $-1.8$ volts.

With the above described memory 10, all of the memory cells 11 are read with subnanosecond speed. One reason for this high speed read is that the select and deselect voltages which occur on the row lines 24, as well as the voltages which occur on the base of the bipolar transistors 31, vary in magnitude by just a small amount. In the embodiment of FIG. 2, those voltages range from $-0.8$ volts to $-1.6$ volts. Since that voltage range is small, the transition from one voltage level to another occurs quickly.

Another reason for the high read speed is that during the READ operation, only the bipolar transistors 31 and 33b switch ON and OFF. None of the field effect transistors 30 switch ON and OFF during a READ since their ON and OFF state is determined solely by the data which is stored in the memory cell 11 to which they are connected.

Still another reason for the high speed read is that when the bipolar transistors 31 are ON, they don't go into saturation. This is evident from FIG. 2 wherein the base-collector junction of the transistors 31 is reverse biased for all combinations of the voltages $V_1$, $v_0$, $V_S$, and $V_D$.

Yet another reason for the high read speed is that the bipolar transistors 31 have an inherent current gain "Beta" which means the base current becomes amplified as it passes out of the emitter. This large emitter current quickly charges the data output lines 32. By comparison in other memories where data output lines are driven by field effect transistors, there is no current gain.

Also with the above described memory 10, the majority of the components in the memory are field effect transistors; and thus the memory cells can be fabricated with a high density. This is because field effect transistors occupy less physical space than bipolar transistors. With, the above described memory, the cell density on an integrated circuit chip is about 80%-90% of the cell density of an all field-effect transistor memory; and at the same time, the memory 10 has the read speed of an all bipolar transistor memory.

Further in the above described memory 10, the constraints that are imposed by equations 41 thru 44 enable the "1" and "0" voltage levels in the memory cells 11 to be set quite close to each other; and, that in turn allows all of the transistors to be scaled down in size. For the memory shows in FIG. 2, voltage $V_1$ must be more positive than $-1.8$ volts and voltage $V_0$ must be more negative than $-2.6$ volts. Preferably, these constraints are met by setting voltage $V_1$ to zero volts and setting voltage $V_0$ between $-2.6$ and $-3.6$ volts. Such a range for the voltages $V_1$ and $V_0$ enables all of the field effect transistors to have a gate length which is as short as $\frac{1}{4}$ micron without breaking down.

Figure 3:
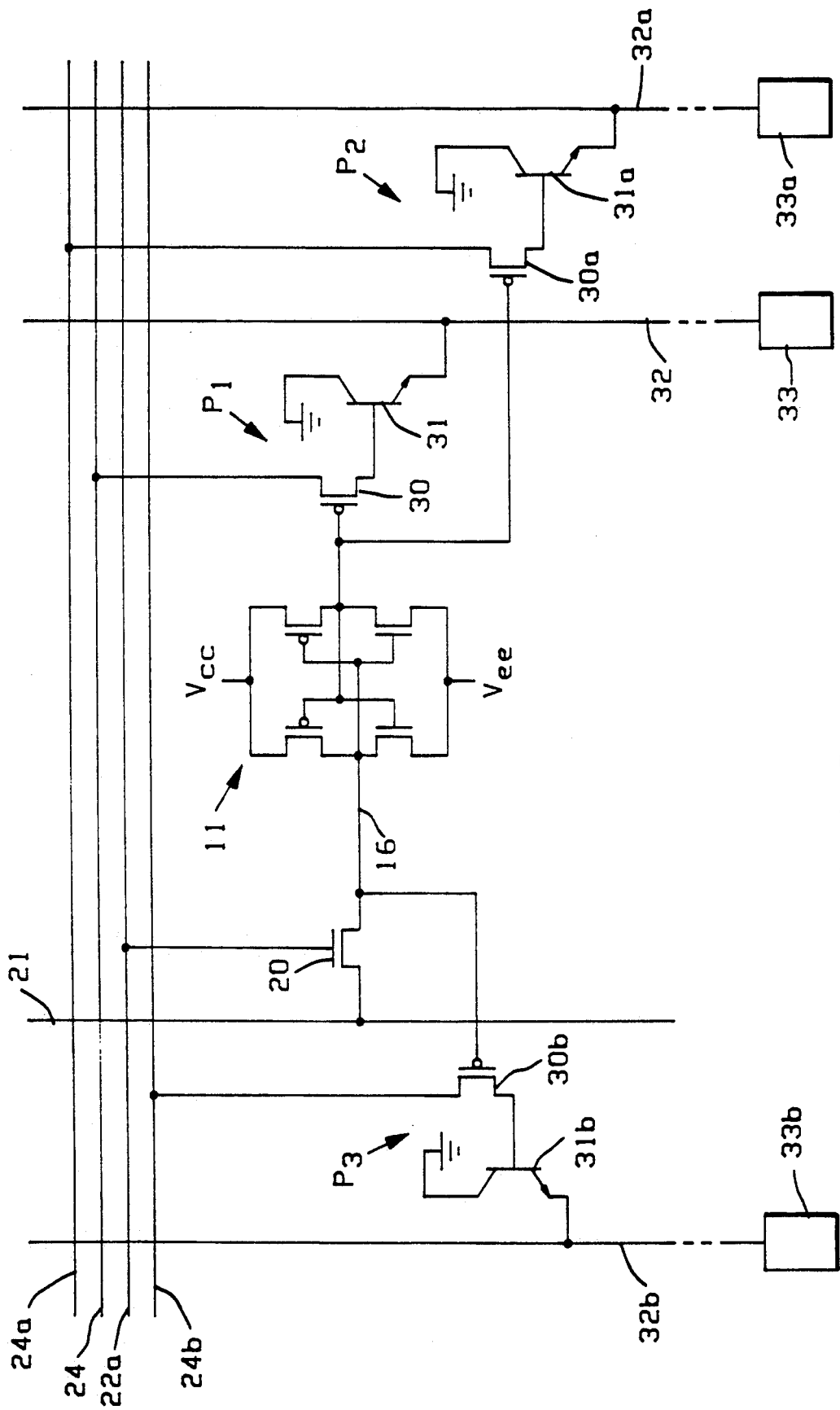
FIG. 3 shows the structure of a second preferred embodiment of the invention.

In addition the above described memory 10 can be easily modified to include any number of READ ports. An example of this modification is shown in FIG. 3 wherein each memory cell 11 has three READ ports P1, P2, and P3. READ port P1 is provided by components 30 and 31; READ port P2 is provided by components 30a and 31a; and READ port P3 is provided by components 30b and 31b.

In a complete memory, the FIG. 3 memory cell is repeated multiple times and arranged in rows and columns. Port P1 of each row of cells has a separate row line 24; port P2 of each row of cells has a separate row line 24a; and port P3 of each row of cells has a separate row line 24b. Similarly, in each column of cells, the READ ports P1, P2, and P3 have a separate data output lines 32, 32a, and 32b as well as separate sense amplifiers 33, 33a, and 33b.

Next, referring to FIG. 4, the structure and operation of a memory 10' which is still another embodiment of the invention will be described. In this embodiment, the previously described P-channel transistor 30 on each memory cell is replaced with an N-channel transistor 50. To turn-ON transistor 50, its gate voltage must be more positive than its drain voltage by a predetermined threshold $V_T$. This ON condition of transistor 50 is met by shifting the select and deselect voltages $V_S$ and $V_D$ downward such that transistor 50 is ON whenever the memory cell 11 to which it is connected stores a binary "1". Each of the transistors 50 which has its gate connected to a memory cell 11 that stores a binary "0" is turned OFF.

Figure 4:
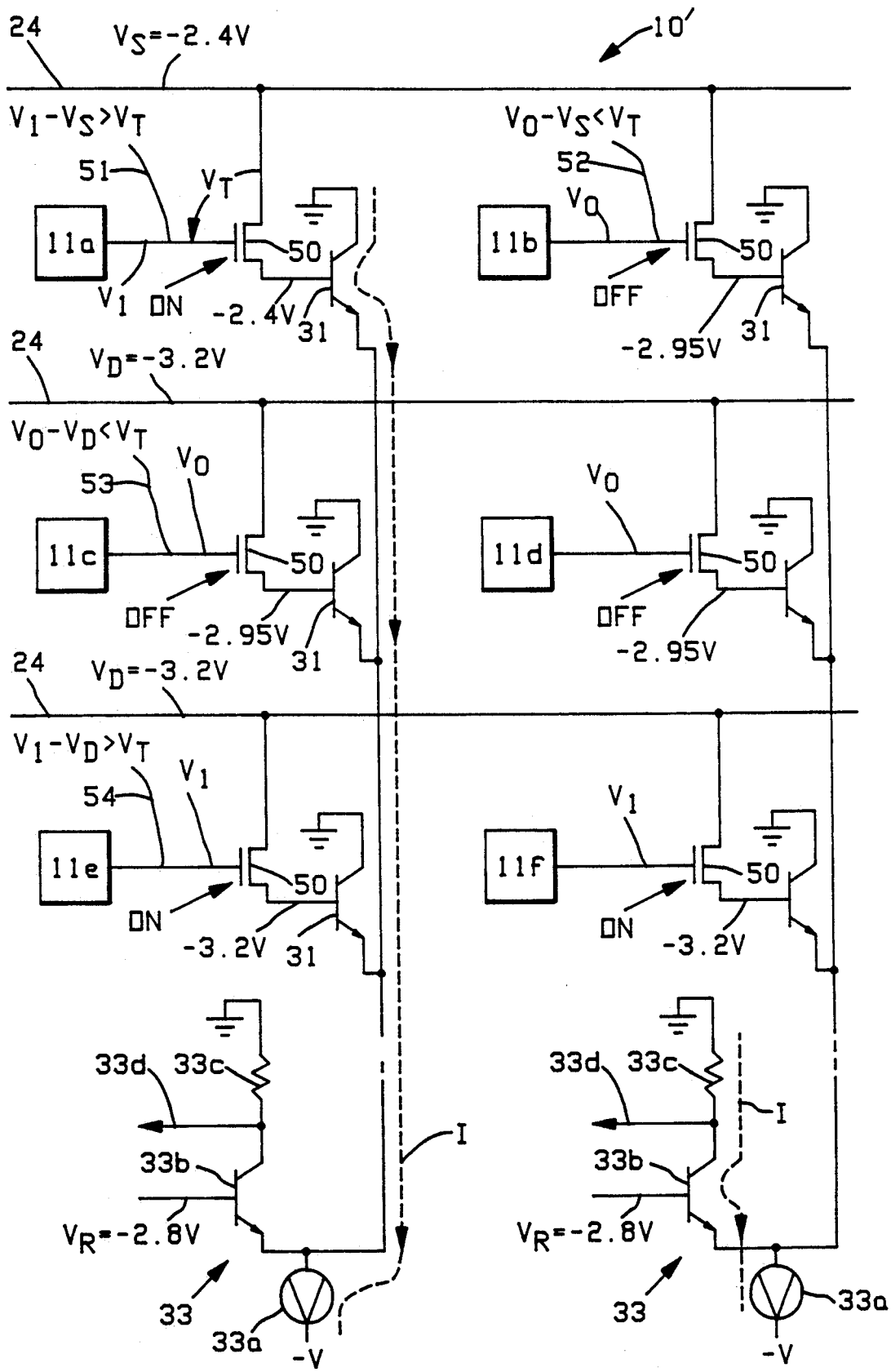
FIG. 4 shows the structure and operation of a third preferred embodiment of the invention; and, FIG. 5 shows the structure and operation of a fourth preferred embodiment of the invention.

In FIG. 4, a binary "1" is stored in the memory cells 11a, 11e, and 11f; and consequently, the transistors 50 to which those cells are connected are turned ON. Conversely, a binary "0" is stored by the memory cells 11b, 11c, and 11d; and thus the transistors 50 to which those cells are connected are turned OFF.

To ensure that the transistors 50 turn ON and OFF as described above, four constraints which given by equations 51 thru 54 must be met. According to equation 51, the voltage $V_1$ minus the voltage $V_S$ must exceed the threshold voltage $V_T$; and according to equation 54, the voltage $V_1$ minus the voltage $V_D$ must exceed the threshold voltage $V_T$. For the case where the select voltage is $-2.4$ volts, the deselect voltage is $-3.2$ volts, and the threshold voltage $V_T$ is about 1 volt, equations 51 and 54 together constrain the voltage $V_1$ to be more positive than $-1.4$ volts.

Equation 52 says the voltage $V_0$ minus the voltage $V_S$ must be less than the threshold voltage $V_T$; and equation 53 says the voltage $V_0$ minus the voltage $V_D$ with less than the threshold $V_T$. For the case where the select voltage is $-2.4$ volts, the deselect voltage is $-3.2$ volts, and the threshold voltage $V_T$ is about 1 volt, both of the equations 52 and 53 are met by constraining voltage $V_0$ to be more negative than $-2.2$ volts.

Each transistor 50 that is ON transfers the row line voltage to the base of the bipolar transistor 31 to which it is connected. Thus in FIG. 4, the select voltage of $-2.4$ volts is transferred to the base of the transistor 31 that is connected to memory cell 11a; and, a deselect voltage of $-3.2$ volts is transferred to the base of the transistors 31 that are connected to the memory cells 11e and 11f.

All of the remaining transistors 50 which are turned OFF decouple their corresponding bipolar transistors 31 from the row lines 24. Consequently, the voltage on the base of those bipolar transistors 31 discharges until those transistors turn OFF. Turn OFF occurs when the base voltage discharges to about 0.15 volts below the sense amplifiers reference voltage $V_R$, which is midway between the select voltage $V_S$ and deselect voltage $V_D$.

If the reference voltage $V_R$ is more positive than the base voltage on all of the transistors 31 of a particular column, then transistor 33b in the sense amplifier for that column passes all of the current I from the current source 33a. This occurs in the right hand column of cells in FIG. 4, and it generates a low voltage from the sense amplifier output line 33d. Conversely, if the reference voltage $V_R$ is more negative than the base voltage on any one of the transistors 31 in a particular column, then the current I from the sense amplifier passes through that one transistor 31. This occurs in the left hand column of cells in FIG. 4; and it generates a high voltage on the sense amplifier output line 33d.

Next, referring to FIG. 5, the structure and operation of a memory 10,, which is still another embodiment of the invention will be described. This memory 10" is similar to the previously described embodiment of FIGS. 1 and 2 with the distinguishing feature being that in the memory 10", each occurrence of two P-channel transistors 30 in a column have their source connected to the base of one bipolar transistor 31.

Figure 5:
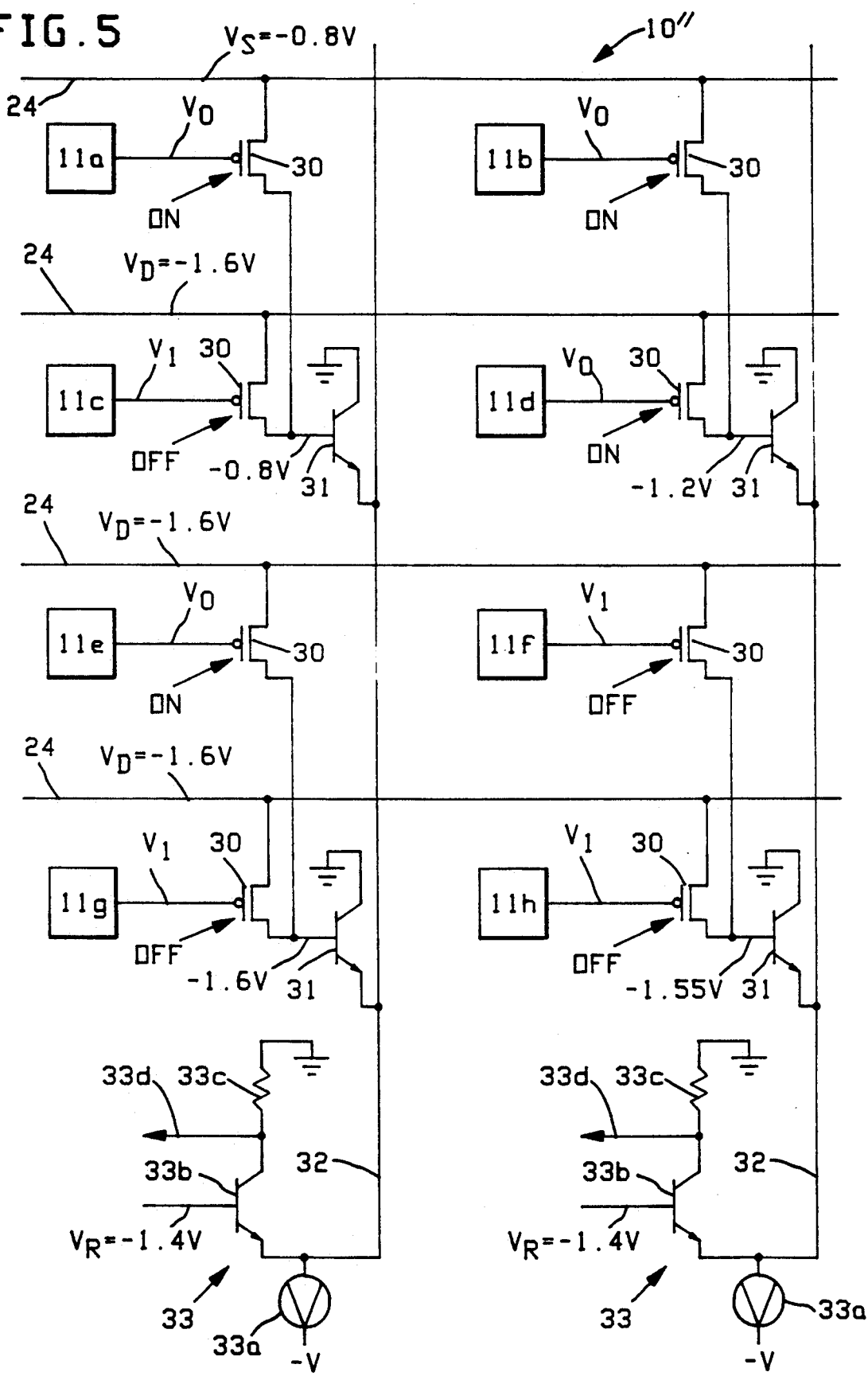

For example, in FIG. 5, four memory cells 11a, 11c, 11e, and 11g are shown as being in one column. There, the P-channel transistors 30 for two of the cells 11a and 11c have their source connected to the base of one bipolar transistor 31; and, the P-channel transistors 30 for the other two cells 11e and 11g have their source connected to the base of another bipolar transistor 31. By this structure, the total number of bipolar transistors 31 in the memory is cut in half in comparison to the number of bipolar transistors in the FIG. 1 memory.

When data is read from the memory 10", the operation of the transistors 30 and 31 together with the sense amplifiers 33 is similar to that which was previously described in conjunction with FIG. 2. In particular, each P-channel transistor 30 which has its gate connected to a memory cell that stores a binary "0" turns ON, and each P-channel transistor 30 which has its gate connected to a memory cell that stores a binary "1" turns OFF. This is true regardless of whether the row line 24 carries the select voltage $V_S$ or the deselect voltage $V_D$.

For example, in the memory 10", a "0" is stored in the memory cells 11a, 11b, 11d, and 11e; and consequently, the P-channel transistors 30 for those cells are ON. All of the remaining memory cells 11c, 11f, 11g and 11h store a "1"; and so the P-channel transistors 30 for those cells are OFF.

When a bipolar transistor 31 is connected to two P-channel transistors 30 which are both OFF, then the voltage on the base of that bipolar transistor discharges until it is about 0.15 volts below the reference voltage $V_R$. This occurs in the memory 10" for the transistors 30 and 31 which are connected to the memory cells 11f and 11h.

When a bipolar transistor 31 is connected to one P-channel transistor which is ON and another P-channel transistor 30 which is OFF, then the ON transistor 30 transfers the row line voltage to the base of that bipolar transistor. This occurs in FIG. 5 for the transistors 30 and 31 which are connected to the memory cells 11a and 11c; and, it also occurs for the transistors 30 and 31 which are connected to the memory cells 11e and 11g.

When a bipolar transistor 31 is connected to two P-channel transistors 30 which are both ON, then both of those transistors 30 attempt to transfer their respective row line voltage to the base of the transistor 31. This occurs in the transistors 30 and 31 for the memory cells 11b and 11d. There, the row line for cell 11b is carrying the select voltage of −0.8 volts; the row line for cell 11d is carrying the deselect voltage of −1.6 volts; and the two P-channel transistors act as a voltage divider. Since the select voltage $V_S$ minus the "0" voltage $V_0$ is larger than the deselect voltage $V_D$ minus the "0" voltage $V_0$, transistor 30 for cell 11b will turn ON more than transistor 30 for cell 11d. Thus, the voltage on the base of transistor 31 will be closer to the select voltage $V_S$ than to the deselect voltage $V_D$. Circuit simulations place this base voltage at −1.0 volts. To aid in properly detecting this −1.0 base voltage as a "0", the sense amplifier reference voltage $V_R$ can be set closer to the deselect voltage $V_D$ than to the select voltage $V_S$ (e.g., at −1.4 volts).

Several preferred embodiments of the invention have now been described in detail. In addition, however, various changes and modifications can be made to those embodiments without departing from the nature and spirit of the invention. For example, in the embodiments of FIGS. 1 thru 5, the memory cells 11 can be modified by replacing the transistors 12 and 13 with resistors, or with diodes, or with N-channel transistors having their gate and drain connected together. Also, in the embodiment of FIG. 3, up to eight read ports can be added by simply duplicating the components 30, 31, 32, 33 and 24 for each additional port. Similarly, in the embodiment of FIG. 4, up to eight read ports can be added by duplicating the components 5, 31, 32, 33 and 24 for each additional part. Further, in the embodiment of FIG. 5, additional chip space can be saved by coupling the base of each bipolar transistor 31 to up to four of the field-effect transistors 30. Accordingly, it is to be understood that the invention is not limited to the illustrated preferred embodiments but is defined by the appended claims.

What is claimed is:

1. An integrated circuit memory that is comprised of a plurality of memory cells which are arranged in rows and columns; wherein, to read data from said cells, said memory has a read port which includes:

a single respective field effect transistor for each memory cell having a gate coupled to an output node of the cell which carries first and second output voltages;

each field effect transistor in a row of memory cells having a drain coupled to a respective row line for the row of cells which is otherwise disconnected from the cells, and which carries select and deselect voltages;

each occurrence of from one to four consecutive field effect transistors in a column of cells having their source coupled only to the base of a respective bipolar transistor such that said base floats when all of the field effect transistors that are coupled thereto are turned OFF;

said first output voltage, second output voltage, select voltage, and deselect voltage being generated such that for each memory cell, said respective field effect transistor is always turned ON when that cell carries said first output voltage on its output node and is otherwise turned OFF; and, each bipolar transistor in a column of memory cells having a collector coupled to a voltage bus and having an emitter coupled via a bit line to a sense amplifier for the column.

2. A memory according to claim 1 wherein said respective field effect transistor for each cell is a P-channel transistor.

3. A memory according to claim 2 wherein each P-channel transistor in a column of cells has its source coupled to the base of a separate one of said bipolar transistors.

4. A memory according to claim 2 wherein from two to four of said P-channel transistors in a column of cells have their source coupled in parallel to the base of a separate one of said bipolar transistors.

5. A memory according to claim 2 wherein each row line carries select and deselect voltages $V_S$ and $V_D$, each cell stores "1" and "0" voltages $V_1$ and $V_0$, and each P-channel transistor has a predetermined threshold voltage $V_T$; and wherein both $V_S-V_0$ and $V_D-V_0$ are larger than $V_T$, and both $V_S-V_1$ and $V_D-V_1$ are less than $V_T$.

6. A memory according to claim 5 wherein said predetermined threshold voltage is about one volt, and said voltage $V_1$ is between 2.6 volts and 3.6 volts higher than said voltage $V_0$.

7. A memory according to claim 5 wherein said select and deselect voltages differ from each other by less than one volt.

8. A memory according to claim 1 wherein said respective field effect transistor for each cell is an N-channel transistor.

9. A memory according to claim 8 wherein each N-channel transistor in a column of cells has its source coupled to the base of a separate one of said bipolar transistors.

10. A memory according to claim 8 wherein from two to four of said N-channel transistors in a column of cells have their source coupled in parallel to the base of a separate one of said bipolar transistors.

11. A memory according to claim 8 wherein each row line carries select and deselect voltages $V_S$ and $V_D$, each cell stores "1" and "0" voltages $V_1$ and $V_0$, and each N-channel transistor has a predetermined threshold voltage $V_T$; and wherein both $V_1-V_S$ and $V_1-V_D$ are larger than $V_T$, and both $V_0-V_S$ and $V_0-V_D$ are less than $V_T$.

12. A memory according to claim 11 wherein said predetermined threshold voltage is about one volt, and said voltage $V_1$ is between 2.6 volts and 3.6 volts higher than said voltage $V_0$.

13. A memory according to claim 11 wherein said select and deselect voltages differ from each other by less than one volt.

14. A memory cell according to claim 1 wherein said read port is repeated from two to eight times.

* * * * *